United States Patent [19]
Krafft et al.

[11] 4,117,427
[45] Sep. 26, 1978

[54] STANDARDIZED COMPONENT FOR CROSS-POINT MATRICES

[75] Inventors: Camille Gabriel Krafft, Bagneux; Jean-Claude Simonet, La Celle St. Cloud; Emmanuel Marie Jammes, Orvault, all of France

[73] Assignee: International Standard Electric Corporation, New York, N.Y.

[21] Appl. No.: 727,115

[22] Filed: Sep. 27, 1976

[51] Int. Cl.² .................................... H01H 67/14
[52] U.S. Cl. ............................ 335/112; 200/307; 361/351; 361/420
[58] Field of Search ............... 335/111, 112, 152; 361/346, 350, 351, 352, 360, 376, 393, 394, 416, 417, 419, 420; 200/307; 174/52 FP

[56] References Cited

U.S. PATENT DOCUMENTS

| 3,448,416 | 6/1969 | Latrubesse et al. | 335/112 |
| 3,873,885 | 3/1975 | Elfverson | 361/417 X |

FOREIGN PATENT DOCUMENTS

| 468,069 | 1/1969 | Switzerland | 200/307 |
| 1,100,801 | 1/1968 | United Kingdom | 200/307 |
| 1,162,904 | 4/1969 | United Kingdom | 335/112 |
| 1,325,267 | 8/1973 | United Kingdom | 335/112 |

Primary Examiner—George Harris
Attorney, Agent, or Firm—John T. O'Halloran; Jeffrey P. Morris

[57] ABSTRACT

Methods and apparatus for manufacturing and assembling standardized components for cross-point switching matrices on a printed circuit board assembly are provided by an insulated strip containing appendages for winding the coils and inserts for housing the relays. The individual components each carrying a plurality of coils and relays are connected into a matrix by means of corresponding guide studs and holes on the alternating sides of each individual component. The method of assembly further provides for winding the coils upon the appendages of each component and soldering each of the components to a continuous circuit board assembly.

3 Claims, 5 Drawing Figures

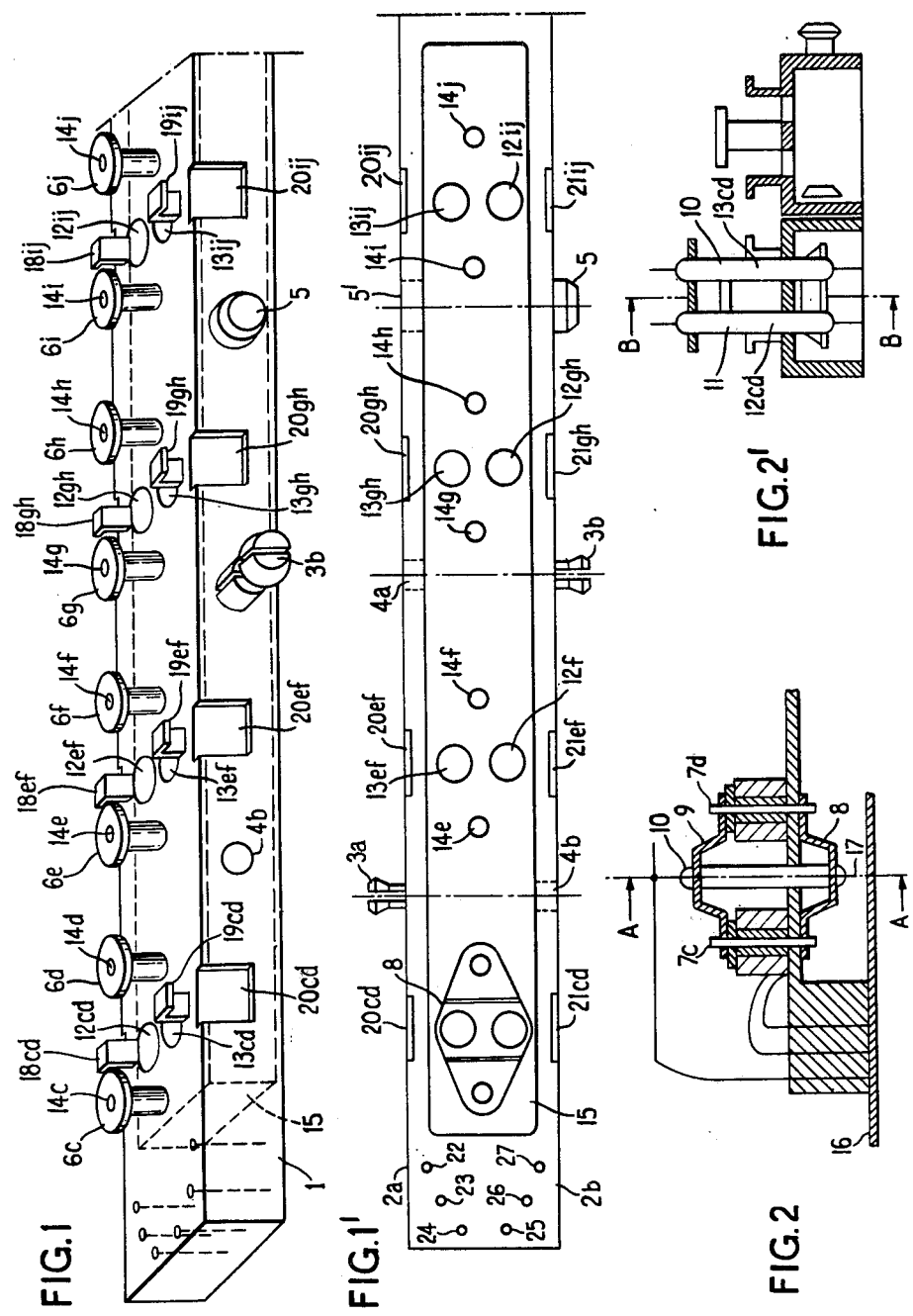

STANDARDIZED COMPONENT FOR CROSS-POINT MATRICES

BACKGROUND OF THE INVENTION

The subject of the present invention is a standardized component forming a support for a given number of coil-operated cross-points for producing switching matrices, as well as the mode of assembly of these matrices.

Such switching matrices are habitually employed in telephone equipment, and the French Pat. Nos. 1,395,840 and 1,482,088 filed by the present applicant describe matrices of this type, which are controlled in a manner described in the French Pat. No. 1,393,336 also filed by the present applicant.

One of the main disadvantages of these matrices for a manufacturer is their relatively large number of auxiliary parts, whose assembly requires a large number of costly manual operations, because they are both manual and time-consuming. For example, the matrix described in patent No. 1,482,088 requires two types of strip carrying the cross-point control coils for the same matrix dimension, and these strips must be of flexible material to allow automatic winding. Consequently, it was necessary to add a chassis to make the assembly rigid and to avoid breaking off connections when handling the matrix. Moreover, different support strips are required for different matrix sizes, which complicates manufacture and the problem of spare parts.

SUMMARY OF THE INVENTION

The present invention thus proposes a standard component forming a support for a given number of coil-operated cross-points for constituting a switching matrix.

According to one characteristic of the invention, the standard component is in the form of a strip approximately rectangular in shape and made of electrically insulating and preferably rigid material, possessing assembly means on its sides to allow preferably rigid assembly of this part with other identical parts in a plane matrix.

The purposes and characteristics of the present invention appear more clearly from the following description of practical examples, the said description referring to the appended drawings in which:

BRIEF DESCRIPTION OF THE DRAWINGS

FIG. 1 is a perspective drawing of a standardized component in accordance with the invention;

FIG. 1' is a bottom view of the standardized component shown in FIG. 1;

FIGS. 2 and 2' are cross-sections of a cross-point assembly in the standardized component of FIG. 1.

DESCRIPTION OF THE PREFERRED EMBODIMENT

Figure 3:
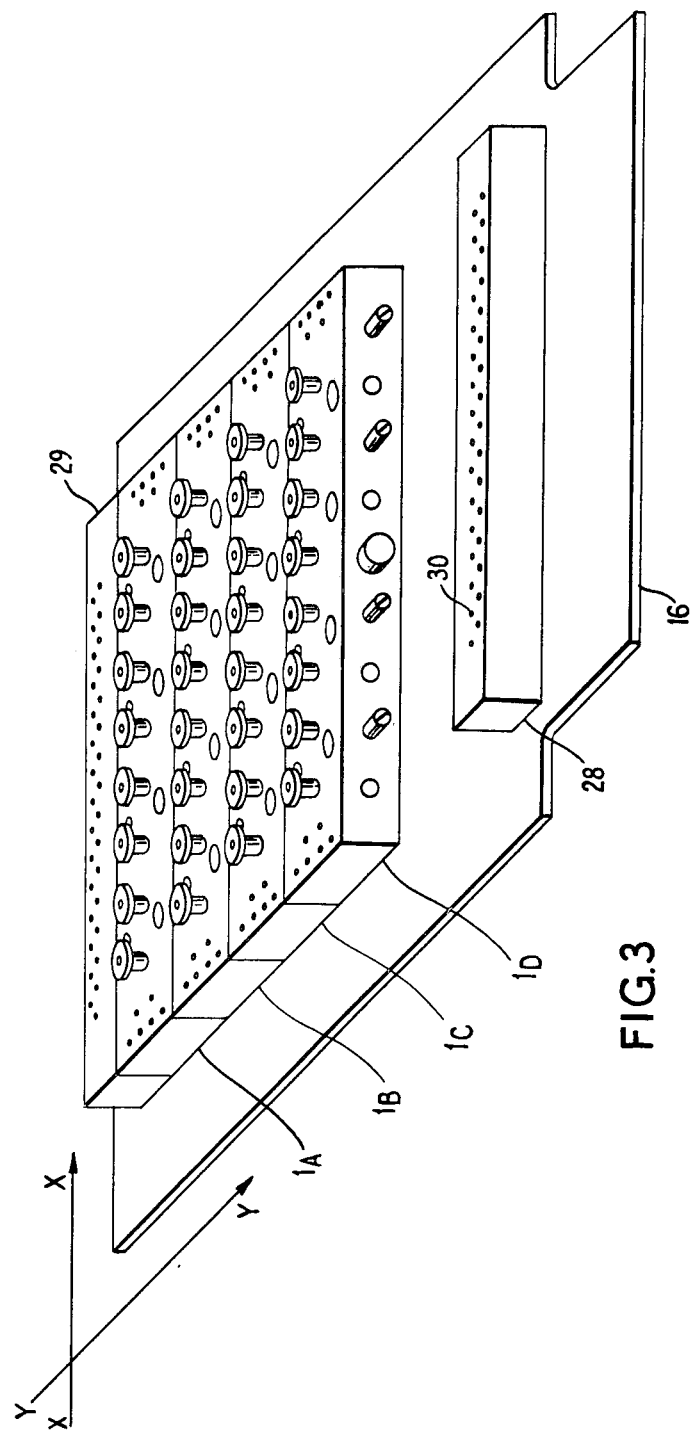
FIG. 3 is a perspective view of an assembly of standardized components in accordance with the invention.

As shown in FIG. 1, the standardized component 1 according to the invention is intended for housing and supporting the constituent parts of a given number of cross-points, e.g. 8, of which four are shown in the example given. This component is designed to be assembled with other identical components to allow the constitution of matrices possessing number of cross-points equal to the product of the number of cross-points carried by a standardized component and the number of standardized components assembled. In this manner, a single standardized component allows the production of different matrices all possessing, however, a number of cross-points which is a multiple of the number of cross-points of a standardized component, i.e. all possessing either the same number of inputs and different numbers of outputs, or vice-versa.

According to the invention, the standardized component 1 is in the form of a rigid strip approximately rectangular in shape and made of electrically insulating material, such as PVC. In accordance with a preferred practical shape, this strip is produced in a mold and combines in a single part the cross-point housings and supports for which it is intended. The strip is preferably made of rigid material to facilitate the positioning of electrical connections and automatic production of the coils, and to avoid connections being broken off when handling the matrix mounted on its printed-circuit board.

According to the invention, the standardized component 1 possess assembly means on its sides, as shown in FIGS. 2 and 2'. These means enable several identical standardized components to be assembled into a support, whose surface depends on the number of standardized components assembled.

In the present practical example, these assembly means on the two sides 2a and 2b of a standardized component 1 are complementary, allowing identical positioning of the standardized components in the support which they constitute by their assembly. In the present case, the assembly means of each component consists of insertable studs, such as 3a and 3b, alternating with seating holes such as 4a and 4b, such that a standardized component 1 can be assembled with another by inserting the stud 3a of one into the hole 4a of the other, and the stud 3b of this other into the hole 4b of the first. In order to ensure exact positioning of a standardized component 1 with respect to another, the two sides 2a and 2b of each standardized component also possesses complementary locating means which, in the example given, consist of a cylindrical stud, such as 5, and the corresponding circular hole 5' of the same diameter. This provides a plane support allowing automatic winding of the coils as described below, since these machines require exact positioning of the coil formers on which the windings are made. The various parts constituting the assembly means are arranged to form a plane support, since the standardized components assembled in the form of a matrix are intended for mounting on a printed-circuit board as shown in FIG. 3.

According to the invention, the standardized components 1 are molded with cylindrical appendages 6 (FIG. 1) on the top surface of each component 1. These appendages 6 are provided for supporting the cross-point coils and therefore consist of a cylindrical body with a cheek on its free end for holding the winding made on an appendage 6 between the cheek of this appendage and the top surface of the component 1 carrying the appendage. The appendages 6 are hollow in order to contain conventional remanent magnetic cores, whose magnetization can be changed by the action of the coils on the appendages. In the practical example shown in FIGS. 1 and 2, the standardized component 1 possesses two appendages (6) per cross-point, each cross-point possessing a magnetic circuit consisting of two magnetic cores 7c and 7d, whose ends are connected by two pole-pieces 8 and 9, these magnetic circuits surrounding contacts of the reed-relay type sealed in glass envelopes 10 and 11. In the present case, the appendages are located on the longitudinal center-line of the component 1, and are traversed by circular holes 14 for positioning the magnetic cores 7 in the plane of the top surface. The holes 14 open into a hollow space 15 provided inside the standardized component 1. This hollow space, which can be provided with partitions for reasons of rigidity, occupies most of the bottom surface of the component 1, and is designed to contain the bottom pole-pieces 8 of the cross-points carried by the component and to allow the insertion of these pole-pieces. For this reason, it also contains the bottom parts of the corresponding sealed contacts. These sealed contacts are placed in the locating holes 12 and 13 provided in the top surface of the component between the cross-point appendages 6 to which they correspond. The locating holes 12 and 13 open into the hollow space 15 since, as described above, their bottom parts are contained in this space and their bottom end connections are designed for soldering to the printed-circuit board 16, as shown by connection 17 in FIG. 2.

According to the invention, the standardized component 1 possesses wire guides 18 and 19 located on the external edges of the outer positioning holes provided the diameter of the bodies of appendages 6 is less than the distance between the extreme edges of the locating holes placed nearer the edge of the standardized component 1 with respect to the transversal center-lines, which is practically always the case. The purpose of these guides is to prevent the coil wires from passing over the sealed contact locating holes during winding when these contacts are not yet installed, since according to the invention and as described below the coils are wound directly on the appendages 6 by a special machine with coordinate control.

In one type of practical example, the standardized component 1 also possesses half-seatings 20 and 21 consisting of recesses along the top half of the sides 2a and 2b, each half-seating coinciding with the corresponding half-seating when two components 1 are assembled, allowing the inserting of magnetic screens with spades fitting into the seatings formed in this manner to provide magnetic screening between the various cross-points.

Finally, the standardized component 1 possesses connection holes such as holes 22 to 27 to allow the connections of the coil leads and the leads from the top ends of the sealed contacts to the printed-circuit board 16, which provides the electrical connections to the circuits external to the matrix. The holes 22 to 27 are fitted with conventional connecting pins which extend from each end of the holes.

In another practical example, as shown in FIG. 3, the matrix constituted by the assembly of standardized components is completed by two end-strips 28 and 29 and which for this reason possess assembly means complementary to those of the outside components 1. These end-strips possess connection holes, such as 30, and the corresponding through-pins for providing the electrical connections in the YY direction between the printed-circuit board and the coils.

In accordance with a preferred variant, the production of matrices using standardized components 1 starts with the insertion and positioning in the components 1 via the hollow space 15 of assemblies, each of which consists of two cores 7 for a given cross-point and the corresponding bottom pole-piece 8 to which the cores have been pre-assembled by, for example, force-fitting.

The matrix itself is then produced by fitting together the required number of components 1 and, if required, the end-strips 28 and 29, this assembly operation being preferably performed by means of an automatic machine.

Following this operation, the coils are wound by an appropriate machine.

In the case of a cross-point matrix operated by coordinate control in accordance with the process defined in the present applicant's French Pat. No. 1,393,336, each appendage 6 is wound with two super-imposed coils, one connected in the XX direction and the other in the YY direction, and the production of the coil assembly consists of four series of operations, since each of the two coil formers for a given cross-point carries two different coils.

The winding machine thus produces in succession for example:

a coil on every other appendage in succession for each of the assembled standardized components, the coils produced on a given standardized element, i.e. corresponding to a given abscissa, being connected in series by the winding wire, i.e. in the XX direction shown in FIG. 3, a coil on each of the remaining appendages on each of the assembled standardized components, the coils produced on a given standardized component also being connected in series by the winding wire again in the XX direction, a coil on each appendage in the YY direction, the coils produced on the appendages having the same order number being connected in series by the winding wire.

As described above, the purpose of the wire guides 18 and 19 shown in FIG. 1 is to prevent the winding wire connecting two coils in series in the XX direction from passing over a locating hole 12 or 13. This prevents damaging the wire when inserting the sealed contacts into the locating holes 12 and 13. As shown in FIG. 1, the heights of the wire guides 18 and 19 may be less than the heights of the coil formers of appendages 6 provided that the two ends of a wound coil appear at the bottom of the appendage, which is a conventional winding arrangement ensuring in the present case that the wires connecting two coils are practically level with the top surfaces of the standardized components.

After the control coils have been wound and connected to the pins through the holes such as 22 or 30 provided in the components 1 and end-strips 28 and 29, the next operation consists in assembling the top pole-pieces 9 on the corresponding cores 7 by force-fitting.

Following this operation, the printed-circuit board 16 is placed on the matrix consisting of components 1 assembled prior to the insertion of the reed-relays in the locating holes 12 and 13 of the assembled components 1. For this purpose, the sealed contacts are presented already connected together by the links between their top connections, and they are positioned such that the bottom connections of these contacts protrude from the hollow space 15 and penetrate the corresponding holes in the printed-circuit board 16 in the same way as the other connections from the components 1 and end-strips 28 and 29 through the various holes provided, for the purpose of making the electrical connections between the printed-circuit and the connecting leads by wave-soldering.

The use of standardized components in accordance with the invention thus facilitates the production of matrices of sizes which are multiples of each other, if required, and to simplify the matrix assembly and winding operations.

Although the principles of the present invention are described above in relation with specific practical examples, it should be clearly understood that the said description is given as an example only and does not limit the scope of the invention.

What is claimed is:

1. A standardized component support for coil-operated cross-points for use in a switching matrix comprising:
    a rectangular strip made of electrically insulating material having complementary assembly means on the sides of the strip to provide rigid assembly of each component with other substantially identical components into a plane matrix, said means containing at least one locating element on one side and a plurality of complementary elements on the other side to ensure the correct relative positioning of the components when assembled into a matrix; and
    a series of identical hollow cylindrical appendages located on the top surface of the components to provide coil formers for a plurality of corresponding cross-point control coils carried by the component.

2. The standardized component of claim 1 wherein the assembly means on one side of the component consist of a plurality of insertable studs alternating with a plurality of insertion holes, the respective positions of the studs and holes being inverted on one side with respect to the other, and wherein the locating element consists of at least one single stud, and the complementary elements consist of at least one circular hold provided in the side of the component.

3. The standardized component of claim 1 for a cross-point matrix having sealed reed-relay contacts solenoid-operated by coils and magnetic cores wherein the magnetization of the cores determines the switching state of the contacts, and the two cores of a given cross-point are connected together by pole-pieces forming a closed magnetic circuit round the contacts comprising:
    a central hollow space within the component open to the top surface of the component by a plurality of hollow cynlindrical appendages for providing the transversal location of the cores and by a plurality of openings for providing the transversal location of the sealed contacts and open at the bottom of the component to allow assembly of one of the two pole-pieces of each of the cross-points carried by the component and the external connections outside of this component to the ends of each sealed contact contained therein.

* * * * *